(12) United States Patent
Saito et al.

(10) Patent No.: US 7,276,773 B2
(45) Date of Patent: Oct. 2, 2007

(54) POWER SEMICONDUCTOR DEVICE

(75) Inventors: Wataru Saito, Kawasaki (JP); Ichiro Omura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 375 days.

(21) Appl. No.: 11/117,342

(22) Filed: Apr. 29, 2005

(65) Prior Publication Data
US 2006/0131644 A1 Jun. 22, 2006

(30) Foreign Application Priority Data
Dec. 21, 2004 (JP) ............. 2004-369713

(51) Int. Cl.
*H01L 29/72* (2006.01)
(52) U.S. Cl. ............. 257/492; 257/493; 257/329; 257/335; 257/341; 257/345
(58) Field of Classification Search ........... 257/329, 257/335, 341, 345, 492, 493
See application file for complete search history.

(56) References Cited

U.S. PATENT DOCUMENTS

| 5,438,215 A | 8/1995 | Tihanyi |
| 6,693,338 B2 * | 2/2004 | Saitoh et al. ............... 257/492 |
| 2004/0129973 A1 | 7/2004 | Saito et al. |

FOREIGN PATENT DOCUMENTS

| JP | 2001-60685 | 3/2001 |
| JP | 2003101022 | 4/2003 |
| JP | 2004-72068 | 3/2004 |
| JP | 2004-119611 | 4/2004 |
| JP | 2004-214511 | 7/2004 |

OTHER PUBLICATIONS

U.S. Appl. No. 11/117,342, filed Apr. 29, 2005, Saito et al.
U.S. Appl. No. 11/668,861, Jan. 30, 2007, Saito et al.
U.S. Appl. No. 11/265,294, filed Nov. 03, 2005, Saito et al.

* cited by examiner

*Primary Examiner*—Edward Wojciechowicz
(74) *Attorney, Agent, or Firm*—Oblon, Spivak, McClelland, Maier & Neustadt, P.C.

(57) ABSTRACT

A power semiconductor device includes second semiconductor layers of a first conductivity type and third semiconductor layers of a second conductivity type alternately disposed on a first semiconductor layer of the first conductivity type. The device further includes fourth semiconductor layers of the second conductivity type disposed in contact with upper portions of the third semiconductor layers between the second semiconductor layers, and fifth semiconductor layers of the first conductivity type formed in surfaces of the fourth semiconductor layers. The first semiconductor layer is lower in impurity concentration of the first conductivity type than each second semiconductor layer. The third semiconductor layer includes a fundamental portion and an impurity-amount-larger portion formed locally in a depth direction and higher in impurity amount than the fundamental portion. The impurity amount is defined by a total amount of impurities of the second conductivity type over a cross section in a lateral direction.

20 Claims, 10 Drawing Sheets

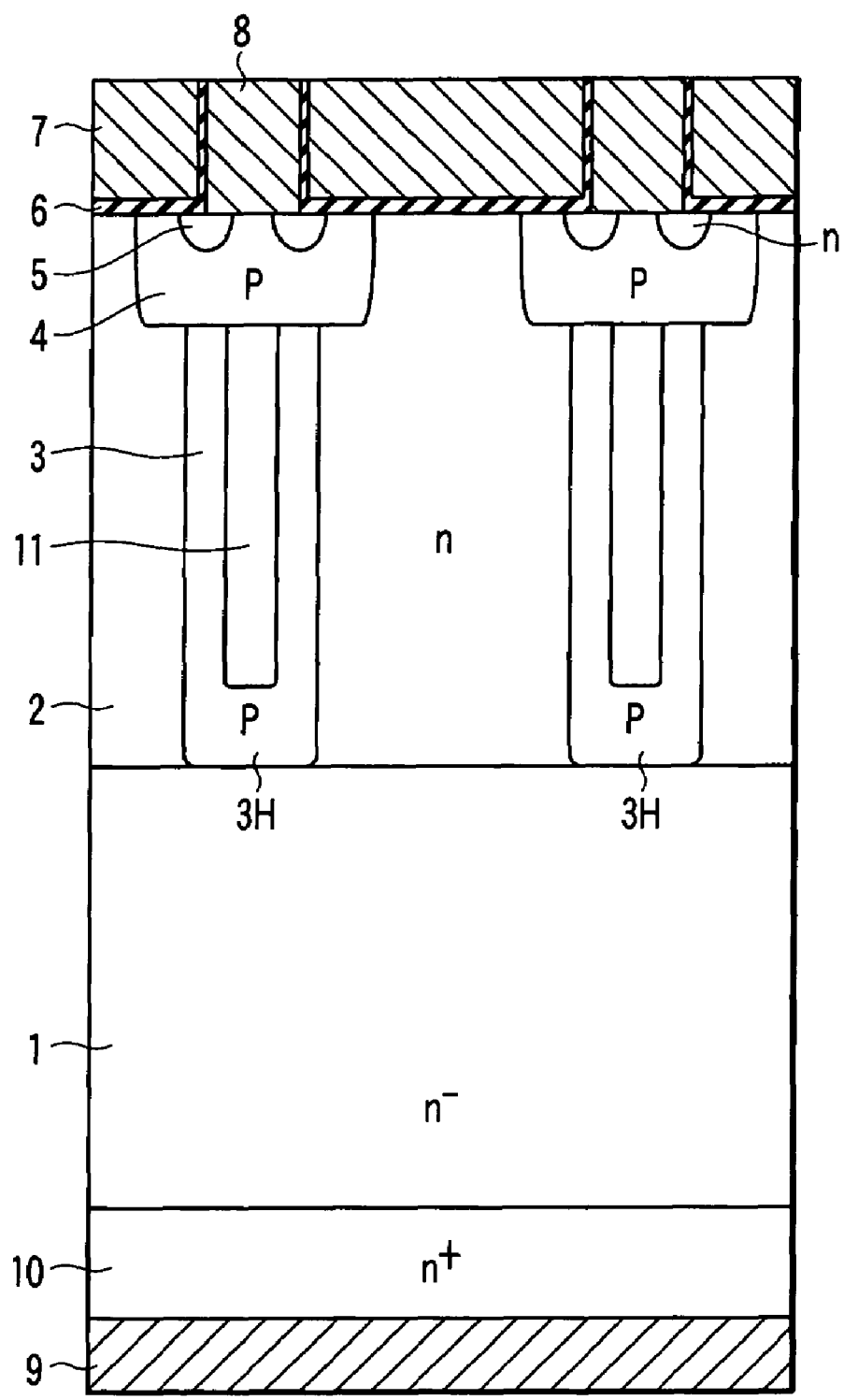
F I G. 6

POWER SEMICONDUCTOR DEVICE

CROSS-REFERENCE TO RELATED APPLICATIONS

This application is based upon and claims the benefit of priority from prior Japanese Patent Application No. 2004-369713, filed Dec. 21, 2004, the entire contents of which are incorporated herein by reference.

BACKGROUND OF THE INVENTION

1. Field of the Invention

The present invention relates to a power semiconductor device used for controlling high power, and particularly to a field effect transistor (MOS FET (Metal-Oxide-Semiconductor Field-Effect Transistor)) of the vertical type.

2. Description of the Related Art

The on-resistance of a vertical type power MOS FET greatly depends on the electric resistance of a conducting layer portion (drift layer). The doping concentration that determines the electric resistance of the drift layer cannot exceed a certain limit in relation to the breakdown voltage of a pn junction formed between the base layer and drift layer. Accordingly, there is a tradeoff relationship between the device breakdown voltage and on-resistance. Overcoming this tradeoff is important in the realization of a device of low power consumption. In relation to this tradeoff, there is a limit determined by the device material, which needs to be exceeded to realize a power MOS FET with an on-resistance lower than conventional devices.

As an example of a vertical type power MOS FET that solves the problems described above, there is a structure, known as a "superjunction structure", in which a p-pillar layer and an n-pillar layer are buried at a position corresponding to a drift layer. In the superjunction structure, the p-pillar layer and n-pillar layer are set to contain the same charge amount (impurity amount), so that a pseudo non-doped layer is created to hold a high breakdown voltage. Further, the n-pillar layer doped at a high concentration is used for electric current to flow therethrough, thereby realizing a low on-resistance beyond the present material limits. Furthermore, where an $n^-$-layer is disposed below the superjunction structure, the tradeoff between the breakdown voltage and on-resistance is improved, as compared with the case of the superjunction structure alone.

A brief explanation will be given of the following Patent publications 1 to 5 listed as related art in relation to the superjunction structure.

[Patent publication 1] Jpn. Pat. Appln. KOKAI Publication No. 2003-101022

[Patent publication 2] Jpn. Pat. Appln. KOKAI Publication No. 2004-119611

[Patent publication 3] Jpn. Pat. Appln. KOKAI Publication No. 2004-72068

[Patent publication 4] Jpn. Pat. Appln. KOKAI Publication No. 2004-214511

[Patent publication 5] U.S. Pat. No. 6,693,338

Patent publication 1 discloses a power MOS FET including a vertical type superjunction structure formed of an n-layer and a p-RESURF layer. In this device, an $n^-$-drift layer having a lower impurity concentration than the n-layer is disposed on the drain side. When a high voltage is applied, the n-layer and p-RESURF layers are completely depleted.

Patent publication 2 discloses a power MOS FET including a vertical type superjunction structure formed of an $n^-$-drift layer and a p-RESURF layer. In this device, the p-RESURF layer has an impurity concentration distributed such that the concentration decreases with increase in the depth (inclination profile). This arrangement prevents the breakdown voltage from decreasing due to imbalance between impurity amounts of the p-RESURF layer and $n^-$-drift layer.

Patent publication 3 discloses a power MOS FET including a vertical type superjunction structure formed of an n-drift region and a p-partition region. In this device, the p-partition region has a higher impurity concentration than the n-drift region on the substrate top side, and vice versa on the substrate bottom side. This arrangement improves the avalanche withstanding capability.

Patent publication 4 discloses a power MOS FET including a vertical type superjunction structure formed of an n-pillar layer and a p-pillar layer. In this device, an $n^-$-drift layer having a lower impurity concentration than the n-pillar layer is disposed on the drain side. The ratio (t/t+d) of the thickness t of the $n^-$-drift layer relative to the total thickness t+d of the $n^-$-drift layer and superjunction structure is set to be 0.72 or less.

Patent publication 5 discloses a power MOS FET including a vertical type superjunction structure formed of an n-second drift layer and a p-RESURF layer. In one type of the devices disclosed in this publication, an n--drift layer having a lower impurity concentration than the n-layer is disposed on the drain side. In another type of the devices disclosed in this publication, no $n^{31}$-drift layer is disposed, and the interior structure or depth of the p-RESURF layer is variously changed.

BRIEF SUMMARY OF THE INVENTION

According to a first aspect of the present invention, there is provided a power semiconductor device comprising:

a first semiconductor layer of a first conductivity type having first and second surfaces respectively on upper and lower sides in a depth direction;

a plurality of second semiconductor layers of the first conductivity type disposed on the first surface of the first semiconductor layer, at intervals in a lateral direction perpendicular to the depth direction;

a plurality of third semiconductor layers of a second conductivity type respectively disposed between the second semiconductor layers;

a plurality of fourth semiconductor layers of the second conductivity type respectively disposed in contact with upper portions of the third semiconductor layers between the second semiconductor layers;

a plurality of fifth semiconductor layers of the first conductivity type respectively formed in surfaces of the fourth semiconductor layers;

a first main electrode electrically connected to the second surface of the first semiconductor layer;

a second main electrode electrically connected to each set of the fourth semiconductor layers and the fifth semiconductor layers; and a gate electrode facing, through a first insulating film, a channel region, which is each of portions of the fourth semiconductor layers interposed between the fifth semiconductor layers and the second semiconductor layers, wherein the first semiconductor layer is lower in impurity concentration of the first conductivity type than each second semiconductor layer, and each third semiconductor layer includes a fundamental portion and an impurity-amount-larger portion, such that the impurity-amount-larger portion is formed locally in the depth direction and is higher in impurity amount than the fundamental portion, where the impurity amount is defined by a total amount of impurities of the second conductivity type over a cross section in the lateral direction.

According to a second aspect of the present invention, there is provided a power semiconductor device comprising:

a first semiconductor layer of a first conductivity type having first and second surfaces respectively on upper and lower sides in a depth direction;

a plurality of second semiconductor layers of the first conductivity type disposed on the first surface of the first semiconductor layer, at intervals in a lateral direction perpendicular to the depth direction;

a plurality of third semiconductor layers of a second conductivity type respectively disposed between the second semiconductor layers;

a plurality of fourth semiconductor layers of the second conductivity type respectively disposed in contact with upper portions of the third semiconductor layers between the second semiconductor layers;

a plurality of fifth semiconductor layers of the first conductivity type respectively formed in surfaces of the fourth semiconductor layers;

a first main electrode electrically connected to the second surface of the first semiconductor layer;

a second main electrode electrically connected to each set of the fourth semiconductor layers and the fifth semiconductor layers; and a gate electrode facing, through a first insulating film, a channel region, which is each of portions of the fourth semiconductor layers interposed between the fifth semiconductor layers and the second semiconductor layers, wherein the first semiconductor layer is lower in impurity concentration of the first conductivity type than each second semiconductor layer, and each third semiconductor layer includes an extension bottom, which extends into the first semiconductor layer beyond an interface position between the first semiconductor layer and each second semiconductor layer.

BRIEF DESCRIPTION OF THE SEVERAL VIEWS OF THE DRAWING

FIG. 6 is a sectional perspective view schematically showing a power semiconductor device (power MOS FET) according to a third embodiment of the present invention;

DETAILED DESCRIPTION OF THE INVENTION

Figure 1D:
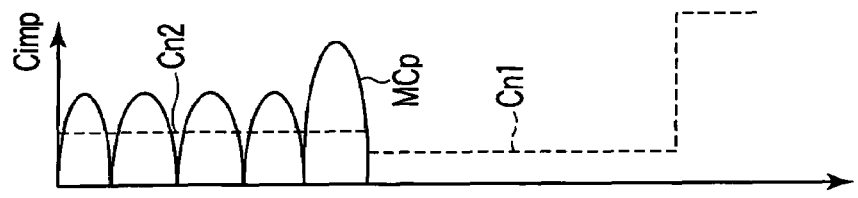
FIG. 1D is a view for explaining a manufacturing step of the device shown in FIG. 1A, using impurity concentration Cimp in the depth direction of the device.

In the process of developing the present invention, the inventors studied vertical type power MOSFETs, such as those disclosed in Patent publications 1 to 5. As a result, the inventors have arrived at the findings given below.

As described above, combining a superjunction structure with an $n^{-}$-drift layer disposed therebelow makes it possible to improve the tradeoff between the breakdown voltage and on-resistance beyond the material limit. However, devices of this kind are required to be further improved in performance and further simplified in terms of manufacturing processes. For example, in order to reduce the on-resistance, it is effective to decrease the arraying frequency of units of a superjunction structure in a lateral direction. However, where units of a superjunction structure are formed at a higher density, the manufacturing process thereof becomes more complex.

Further, where a superjunction structure is used, the impurity amounts of an n-pillar layer and a p-pillar layer need to be accurately controlled, so as to maintain the breakdown voltage. A change in impurity amount causes a change in position at which avalanche breakdown occurs. As a consequence, the avalanche withstanding capability tends to depend on the impurity amount. For this reason, in the manufacturing process, it is very important to suppress fluctuations in the impurity amounts of pillar layers.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary. In the following embodiments, the first conductivity type is n-type, and the second conductivity type is p-type.

First Embodiment

Figure 1C:
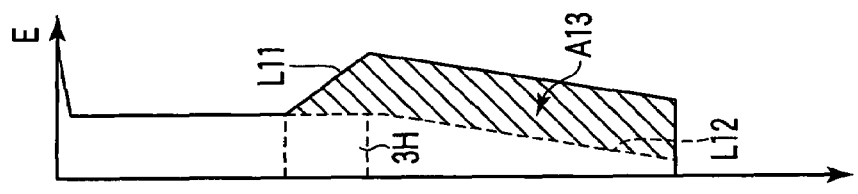
FIG. 1C is a view showing the distribution of electric field intensity E in the depth direction of the device shown in FIG. 1A.
Figure 1B:
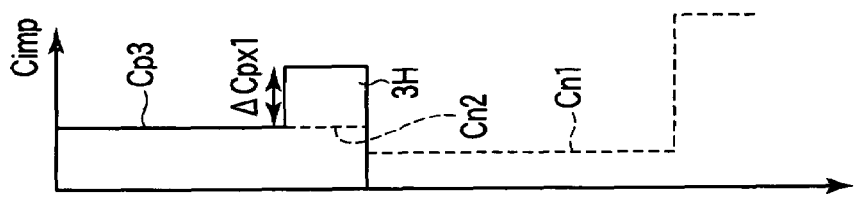
FIG. 1B is a view showing a profile of impurity concentration Cimp in the depth direction of the device shown in FIG. 1A.
Figure 1A:
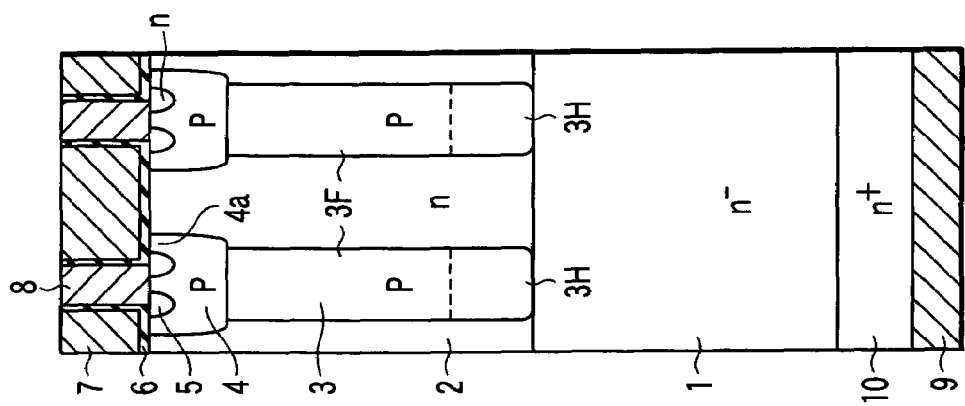
FIG. 1A is a sectional perspective view schematically showing a power semiconductor device (power MOS FET) according to a first embodiment of the present invention.

FIG. 1A is a sectional perspective view schematically showing a power semiconductor device (power MOS FET) according to a first embodiment of the present invention. As shown in FIG. 1A, this MOS FET includes an $n^{31}$-drift layer (a first semiconductor layer of a first conductivity type) 1 having a high resistivity (a low impurity concentration) provided in a semiconductor substrate. An $n^+$-drain layer 10 having a low resistivity (a high impurity concentration) is disposed on the bottom surface (a second surface in the depth direction) of the $n^{31}$-drift layer 1.

A plurality of n-pillar layers (second semiconductor layers of the first conductivity type) 2 are disposed on the top surface (a first surface in the depth direction) at intervals in a lateral direction perpendicular to the depth direction. A plurality of p-pillar layers (third semiconductor layers of a second conductivity type) 3 are respectively disposed between the n-pillar layers 2. The n-pillar layers 2 and p-pillar layers 3 are formed in stripes extending in a direction perpendicular to the sheet face of FIG. 1A. The n-pillar layers 2 and p-pillar layers 3 form a superjunction structure that provides a low on-resistance.

The impurity concentrations in the n-pillar layers 2 and p-pillar layers 3 are set to be higher than the impurity concentration in the $n^{31}$-drift layer. It should be noted that the term "impurity concentration" means the concentration of impurities active as carriers. More specifically, the n-type impurity concentration in the $n^{31}$-drift layer is set at $8\times10^{13}$ to $2.5\times10^{16}$ cm$^{-3}$, the n-type impurity concentration in the n-pillar layers 2 is set at $1\times10^{15}$ to $3\times10^{16}$ cm$^{-3}$, and the p-type impurity concentration in the p-pillar layers 3 is set at $1\times10^{15}$ to $4\times10^{16}$ cm$^{-3}$.

A plurality of p-base layers (fourth semiconductor layers of the second conductivity type) 4 are disposed in contact with the top portions of the p-pillar layers 3 between the n-pillar layers 2. A plurality of n-source layers (fifth semiconductor layers of the first conductivity type) 5 having a low resistivity (a high impurity concentration) are disposed in the surfaces of the p-base layers 4. The p-base layers 4 and n-source layers 5 are formed by means of impurity diffusion.

The p-base layers 4 and n-source layers 5 are also formed in stripes extending in a direction perpendicular to the sheet face of FIG. 1A, as in the n-pillar layers 2 and p-pillar layers 3.

A plurality of gate electrodes 7 are disposed in stripes on the n-pillar layers 2 on the top side of the device, each through a gate insulating film 6 consisting of a silicon oxide film having a thickness of, e.g., about 0.1 μm. Each of the gate electrodes 7 has a width to bridge two n-source layers 5 on the opposite sides of one of the n-pillar layers 2. Accordingly, the gate electrode 7 faces portions 4a of two p-base layers 4 between the two n-source layers 5 and the one of the n-pillar layers 2, through the gate insulating film 6. Each of the portions 4a of the p-base layers 4 works as a channel region of the power MOS FET.

Source electrodes (second main electrodes) 8 are disposed between the gate electrodes 7 and in electric contact with the p-base layers 4 and n-source layers 5. On the other hand, a drain electrode (first main electrode) 9 is disposed in electric contact with the $n^+$-drain layer 10 on the bottom side of the device. The drain electrode 9 is electrically connected to the bottom surface of the $n^{31}$-drift layer 1 through the $n^+$-drain layer 10.

FIG. 1B is a view showing a profile of impurity concentration Cimp in the depth direction of the device shown in FIG. 1A. In FIG. 1B, Cn1, Cn2, and Cp3 denote the n-impurity concentration in the $n^-$-drift layer 1, the n-impurity concentration in each n-pillar layer 2, and the p-impurity concentration in the fundamental portion 3F of each p-pillar layer 3, respectively. The n-impurity concentration Cn2 in the n-pillar layer 2, and the p-impurity concentration Cp3 in the fundamental portion 3F of the p-pillar layer 3 are essentially the same in value.

As shown in FIG. 1B, each p-pillar layer 3 is arranged such that the p-impurity concentration in the bottom is higher by ΔCpx1 than the p-impurity concentration CP3 in the fundamental portion 3F. On the other hand, as shown in FIG. 1A, each p-pillar layer 3 has an essentially constant width over the entirety in the depth direction. As a consequence, the p-pillar layer 3 is set to have a predetermined portion (impurity-amount-larger portion) 3H at the bottom, so that the impurity amount in the layer 3 locally increases in the depth direction. The term "impurity amount" used for the p-pillar layer 3 is defined by the total amount of p-impurities over a cross section (i.e., cross sectional area × concentration) in a lateral direction perpendicular to the depth direction. Accordingly, this embodiment utilizes the impurity concentration profile of the p-pillar layer 3 in the depth direction as a factor to form the impurity-amount-larger portion 3H.

FIG. 1C is a view showing the distribution of electric field intensity E in the depth direction of the device shown in FIG. 1A. In FIG. 1C, a solid line L11 denotes an electric field intensity distribution in a case where the impurity-amount-larger portion 3H is formed at the bottom of the p-pillar layer 3. A broken line L12 denotes an electric field intensity distribution in a case where the impurity amount in the p-pillar layer 3 is set to be uniform. A hatched portion A13 denotes an increase in breakdown voltage due to the change in electric field intensity distribution.

As shown in FIG. 1C, in the device according to this embodiment, the electric field intensity becomes higher at the bottom of the p-pillar layer 3 due to the impurity concentration profile. This increases the electric field intensity in the $n^-$-drift layer 1, and thereby brings about an electric field intensity distribution shown by the solid line L11. As a consequence, the $n^-$-drift layer 1 can hold a higher voltage and improve the breakdown voltage. Further, the breakdown voltage can be increased without any change in the impurity concentrations of the n-pillar layer 2 and n⁻-drift layer 1 on which the on-resistance depends, thereby improving the tradeoff between the breakdown voltage and on-resistance. Furthermore, in this device, a high avalanche withstanding capability can be obtained with high reproducibility, due to the factors described below.

Specifically, in general, the avalanche withstanding capability is influenced a great deal by the action of a parasitic bipolar transistor constituted of the n-pillar layer 2, p-base layer 4, and n-source layer 5. Where the concentration in the p-pillar layers 3 is uniform, avalanche breakdown occurs at the bottom of the p-base layer 4 or the bottom of the p-pillar layer 3. If avalanche breakdown occurs at the bottom of the p-base layer 4, the parasitic bipolar transistor easily acts, resulting in a low avalanche withstanding capability. On the other hand, if avalanche breakdown occurs at the bottom of the p-pillar layer 3, the parasitic bipolar transistor does not easily act, resulting in a high avalanche withstanding capability. In this way, the avalanche withstanding capability greatly depends on the breakdown position. In this respect, the breakdown position is determined by the electric field intensity distribution in the superjunction structure. If the impurity concentrations in the n-pillar layer 2 and p-pillar layer 3 fluctuate and thereby change the electric field intensity distribution, the breakdown position is shifted. Accordingly, the position at which avalanche breakdown occurs and the avalanche withstanding capability probably vary depending on the process (i.e., the reproducibility is low).

On the other hand, in the device according to this embodiment, the electric field intensity is highest at the bottom of the p-pillar layer 3 due to the impurity-amount-larger portion 3H. In this case, even if the impurity concentrations in the n-pillar layer 2 and p-pillar layer 3 fluctuate to some extent, the position at which avalanche breakdown occurs is always at the bottom of the p-pillar layer 3. In other words, avalanche breakdown always occurs at the same position, and thus the avalanche withstanding capability fluctuates less. As a consequence, these characteristics can be obtained with high reproducibility for a plurality of devices.

FIG. 1D is a view for explaining a manufacturing step of the device shown in FIG. 1A, using impurity concentration Cimp in the depth direction of the device. A p-pillar layer 3 having a profile shown in FIG. 1B, in which the impurity concentration is locally higher, can be easily formed by a process of repeating ion implantation and buried crystal growth. Specifically, where boron ion implantation and buried crystal growth are repeated and annealing is then performed, a wavy profile MCp shown in FIG. 1D is formed. In this process, the amount of boron ion implantation at the first step is set to be larger, so that the impurity concentration in the p-pillar layer 3 is higher only at the bottom.

Figure 2A:
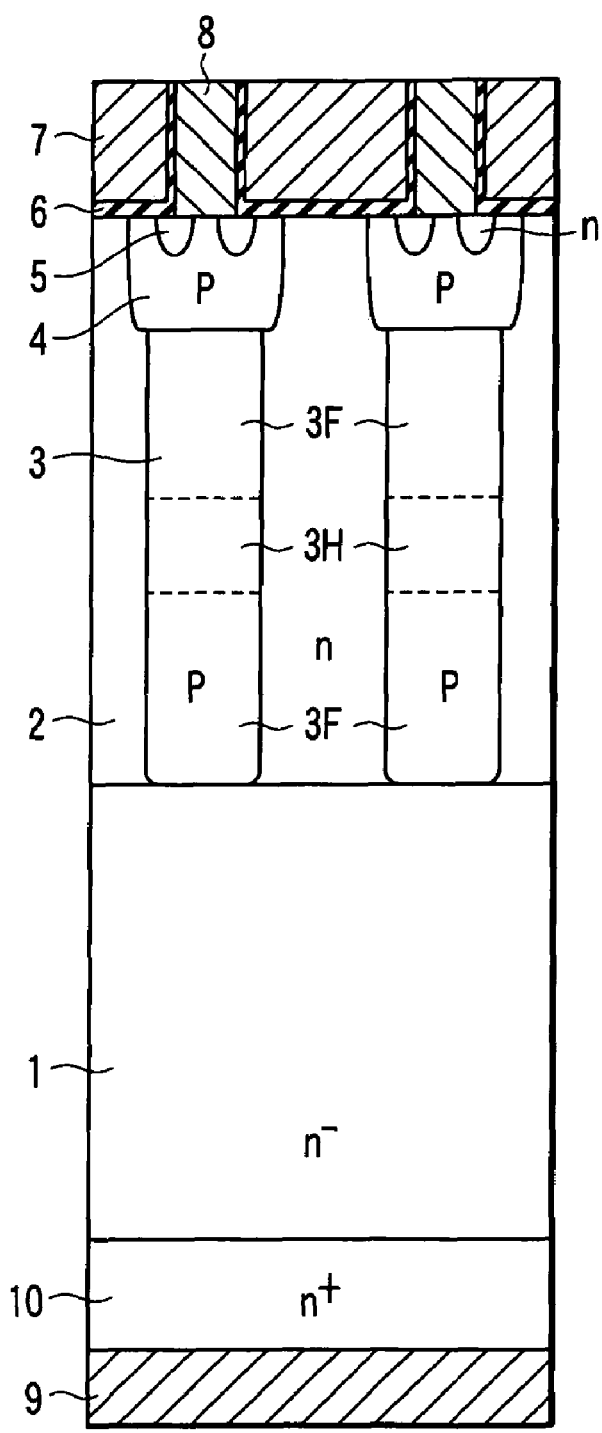
FIG. 2A is a sectional perspective view schematically showing a power semiconductor device (power MOS FET) according to a modification of the first embodiment of the present invention.
Figure 2B:
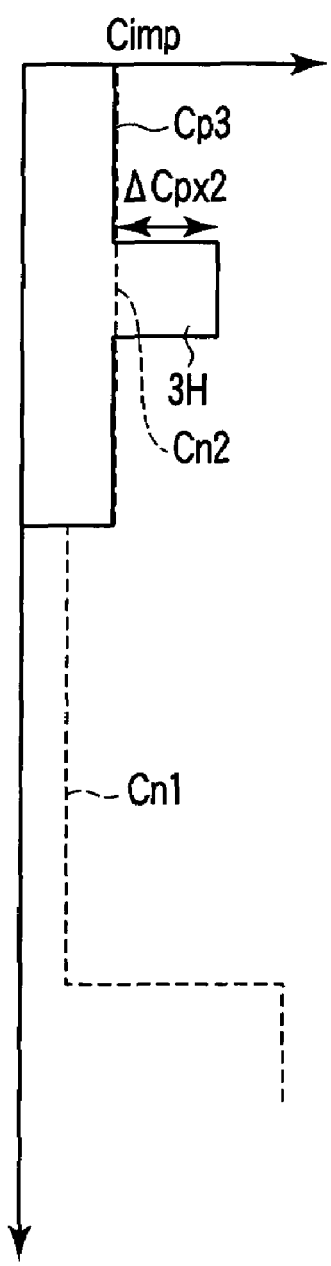
FIG. 2B is a view showing a profile of impurity concentration Cimp in the depth direction of the device shown in FIG. 2A.

FIG. 2A is a sectional perspective view schematically showing a power semiconductor device (power MOS FET) according to a modification of the first embodiment of the present invention. FIG. 2B is a view showing a profile of impurity concentration Cimp in the depth direction of the device shown in FIG. 2A. As shown in FIG. 2B, the p-pillar layer 3 of this modification is arranged such that the p-impurity concentration in the central portion is higher by $\Delta Cpx2$ than the p-impurity concentration CP3 in the fundamental portion 3F. On the other hand, as shown in FIG. 2A, the p-pillar layer 3 has an essentially constant width over the entirety in the depth direction. As a consequence, the p-pillar layer 3 is set to have a predetermined portion (impurity-amount-larger portion) 3H at the central portion, so that the impurity amount in the layer 3 locally increases in the depth direction. As in this modification, where the impurity-amount-larger portion 3H is formed around the central portion of the p-pillar layer 3 instead of the bottom, it can provide an effect similar to that described above. Further, the position at which avalanche breakdown occurs is always at the impurity-amount-larger portion 3H, whereby a high avalanche withstanding capability can be obtained with high reproducibility.

Figure 3:
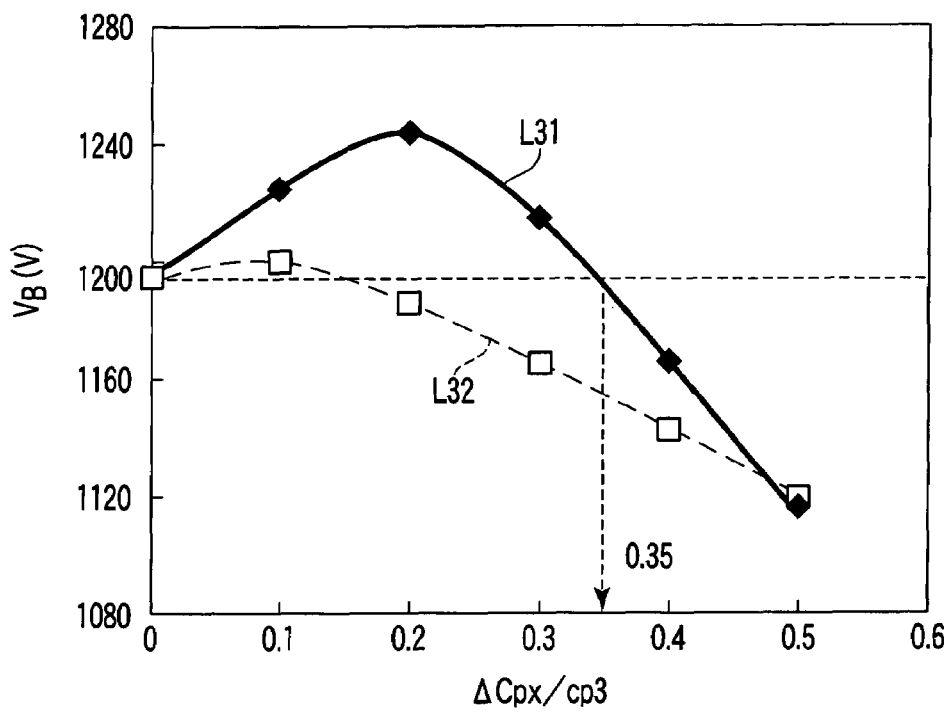
FIG. 3 is a graph showing the relationship between the impurity concentration in an impurity-amount-larger portion of a p-pillar layer and the device breakdown voltage.

FIG. 3 is a graph showing the relationship between the impurity concentration in an impurity-amount-larger portion of a p-pillar layer and the device breakdown voltage. In FIG. 3, the horizontal axis indicates a ratio $\Delta Cpx/CP3$ of a concentration increase $\Delta Cpx$ ($\Delta Cpx1$ or $\Delta Cpx2$) of the impurity-amount-larger portion 3H relative to the p-impurity concentration CP3 in the fundamental portion 3F of the p-pillar layer 3. The vertical axis indicates the device breakdown voltage VB. A line L31 denotes a characteristic obtained by the concentration profile shown in FIG. 1B where the impurity-amount-larger portion 3H is disposed at the bottom. A line L32 denotes a characteristic obtained by the concentration profile shown in FIG. 2B where the impurity-amount-larger portion 3H is disposed at the central portion.

As shown in FIG. 3, where the impurity concentration increase $\Delta Cpx$ in the impurity-amount-larger portion 3H is too large, the electric field intensity at this portion becomes excessively high, thereby lowering the breakdown voltage VB rather than raising it. In the case of the line L31, if the increase $\Delta Cpx$ exceeds 0.35, i.e., the concentration in the bottom of the p-pillar layer 3 is 1.35 or more times the concentration in the other portions, the breakdown voltage VB becomes lower than in a case where the impurity concentration is uniform. Accordingly, in this case, the impurity concentration in the impurity-amount-larger portion 3H disposed at the bottom is preferably set to be 1 to 1.35 times that of the fundamental portion 3F. On the other hand, in the case of the line L32, if the increase $\Delta Cpx$ exceeds 0.15, i.e., the concentration in the bottom of the p-pillar layer 3 is 1.15 or more times the concentration in the other portions, the breakdown voltage VB becomes lower than in a case where the impurity concentration is uniform. Accordingly, in this case, the impurity concentration in the impurity-amount-larger portion 3H disposed at the central portion is preferably set to be 1 to 1.15 times that of the fundamental portion 3F.

As described above, the impurity-amount-larger portion 3H is more effective in increasing the breakdown voltage VB, if it is disposed at the bottom of the p-pillar layers 3 rather than at the central portion. The impurity-amount-larger portion 3H is thus preferably disposed at a position below the central portion of the p-pillar layer 3. This is so, because the impurity-amount-larger portion 3H is more influential on the electric field intensity within the n⁻-drift layer 1, as the position of this portion 3H is closer to the bottom of the p-pillar layer 3.

Figure 4:
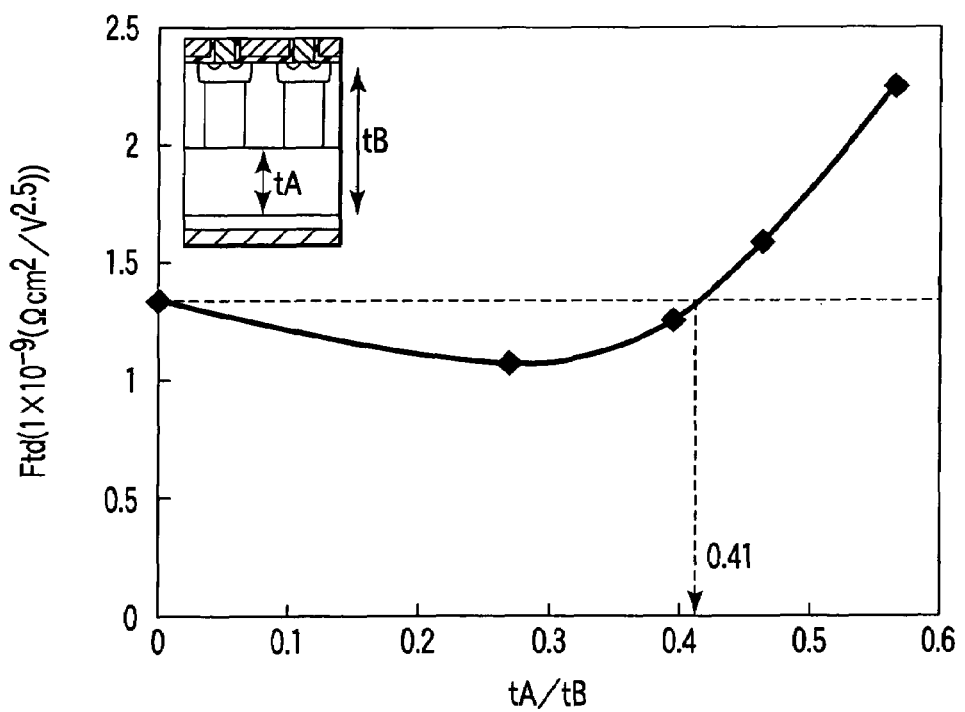
FIG. 4 is a graph showing the relationship between the thickness of an $n^{-}$-drift layer and the tradeoff of on-resistance/breakdown voltage.

FIG. 4 is a graph showing the relationship between the thickness of an n⁻-drift layer and the tradeoff of on-resistance/breakdown voltage. In FIG. 4, the horizontal axis indicates a ratio tA/tB of the thickness tA of the n⁻-drift layer 1 relative to the total thickness tB of the n-pillar layer 2 and n⁻-drift layer 1. The vertical axis indicates a value Ftd obtained by dividing the on-resistance by the 2.5th power of the breakdown voltage, which is based on the fact that the on-resistance is in proportion to the 2.5th power of the breakdown voltage. Accordingly, in FIG. 4, a lower value Ftd means a better device characteristic.

The breakdown voltage can be increased by reducing the impurity concentration in the n⁻-drift layer 1 and increasing the thickness of the n⁻-drift layer 1. However, as the thickness of the n⁻-drift layer 1 is larger, the resistance of the electric current passage thereby increases, resulting in a higher on-resistance. As such, there is a tradeoff relationship between the breakdown voltage and on-resistance, involving the thickness of the n⁻-drift layer 1 as a parameter. As shown in FIG. 4, where the ratio tA/tB exceeds 41%, the value Ftd becomes larger than in a case where the n⁻-drift layer 1 is omitted. Accordingly, the ratio of the thickness of the n⁻-drift layer 1 relative to the total thickness of the n-pillar layer 2 and n⁻-drift layer 1 (the thickness of the entire drift region) is preferably set to be 0 to 0.41.

This embodiment utilizes the impurity concentration profile of the p-pillar layer 3 in the depth direction as a factor to form the impurity-amount-larger portion 3H. However, as in embodiments described later, another parameter is usable as a factor to form the impurity-amount-larger portion 3H. In the case of such an embodiment, the ratio of the impurity amount increase ΔCpx in the impurity-amount-larger portion 3H, and the position of the impurity-amount-larger portion 3H should be set within the same preferable ranges as those described with reference to FIG. 3. Further, the ratio tA/tB of the thickness tA of the n⁻-drift layer 1 relative to the total thickness tB of the n-pillar layer 2 and n⁻-drift layer 1 should be set within the same preferable range as that described with reference to FIG. 4.

Second Embodiment

Figure 5:
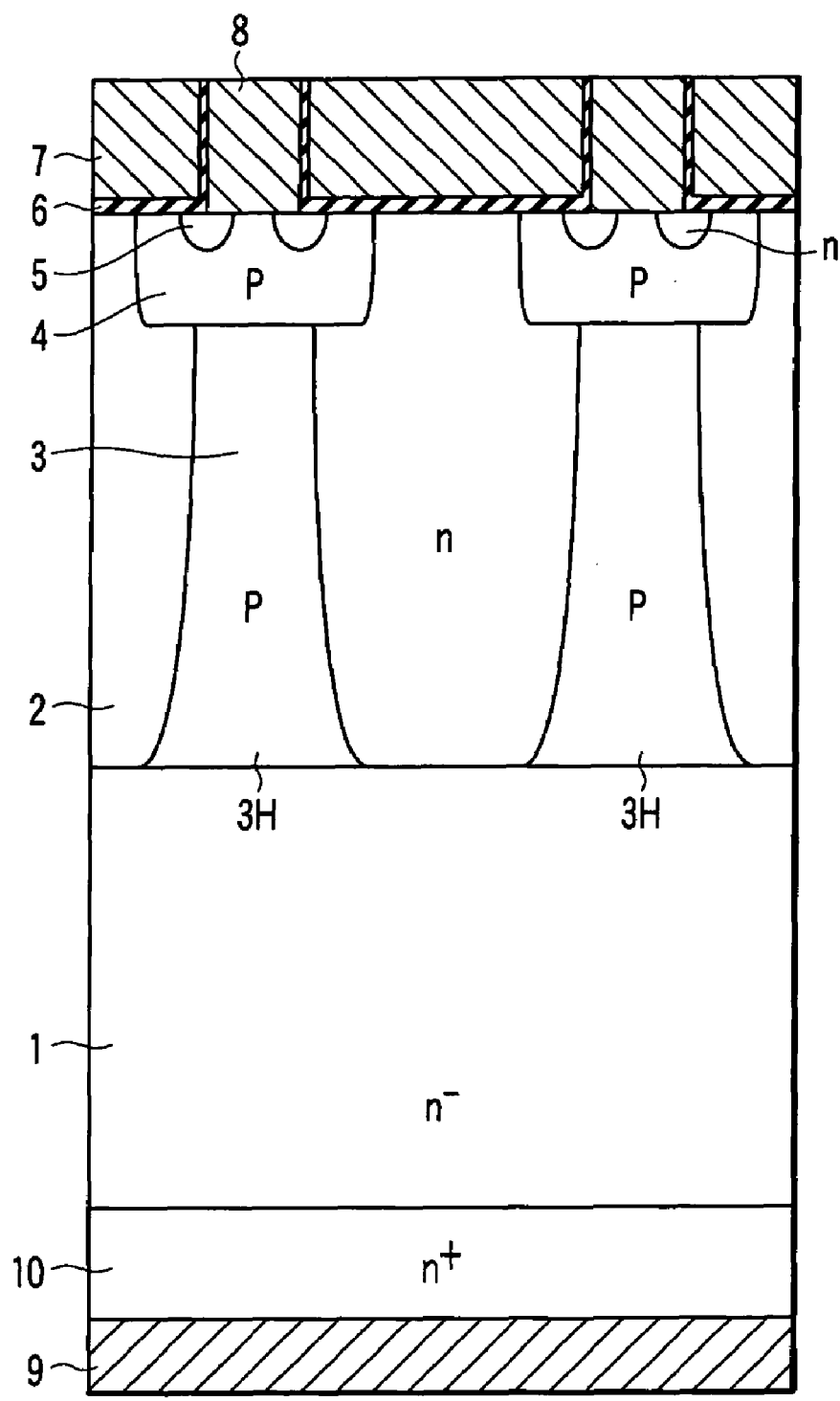
FIG. 5 is a sectional perspective view schematically showing a power semiconductor device (power MOS FET) according to a second embodiment of the present invention.

FIG. 5 is a sectional perspective view schematically showing a power semiconductor device (power MOS FET) according to a second embodiment of the present invention. As shown in FIG. 5, this device includes p-pillar layers 3 each of which has a width gradually increased toward the bottom. On the other hand, each p-pillar layer 3 has an essentially uniform p-impurity concentration over the entirety in the depth direction. As a consequence, the p-pillar layer 3 is set to have a predetermined portion (impurity-amount-larger portion) 3H at the bottom, so that the impurity amount in the layer 3 locally increases in the depth direction. As described previously, the term "impurity amount" used for the p-pillar layer 3 is defined by the total amount of p-impurities over a cross section (i.e., cross sectional area × concentration) in a lateral direction perpendicular to the depth direction. Accordingly, this embodiment utilizes the effective width profile of the p-pillar layer 3 in the depth direction as a factor to form the impurity-amount-larger portion 3H.

As in this embodiment, where the effective width profile of the p-pillar layer 3 in the depth direction is used as a factor to form the impurity-amount-larger portion 3H, it can also provide the same effect as described above. Further, the position at which avalanche breakdown occurs is always at the impurity-amount-larger portion 3H, whereby a high avalanche withstanding capability can be obtained with high reproducibility. The superjunction structure shown in FIG. 5 can be formed by a process that includes preparing a substrate with an n⁻-layer and a p-layer stacked one on the other, forming tapered trench grooves in the surface of the p-layer, and filling the grooves with an n-semiconductor.

Third Embodiment

FIG. 6 is a sectional perspective view schematically showing a power semiconductor device (power MOS FET) according to a third embodiment of the present invention. As shown in FIG. 6, this device includes p-pillar layers 3 in each of which a non-doped layer 11 having no conductivity type extends in the depth direction not to reach the bottom of the p-pillar layer 3. On the other hand, each p-pillar layer 3 itself has an essentially uniform p-impurity concentration over the entirety in the depth direction. As a consequence, the p-pillar layer 3 is set to have a predetermined portion (impurity-amount-larger portion) 3H at the bottom, so that the impurity amount in the layer 3 locally increases in the depth direction.

In the structure shown in FIG. 6, the portion of the p-pillar layer 3 above the impurity-amount-larger portion 3H has a smaller effective width than the impurity-amount-larger portion 3H, due to the presence of the non-doped layer 11. From this point of view, the third embodiment can be considered as using the effective width profile of the p-pillar layer 3 in the depth direction as a factor to form the impurity-amount-larger portion 3H, as in the second embodiment.

Alternatively, a p-layer that has a lower p-impurity concentration than the p-pillar layer 3 may be disposed, in place of the non-doped layer 11, in the p-pillar layer 3 to form the impurity-amount-larger portion 3H at the bottom of the p-pillar layer 3. Such a modification can be considered as using the impurity concentration profile of the p-pillar layer 3 in the depth direction as a factor to form the impurity-amount-larger portion 3H, as in the first embodiment.

As in this embodiment, where a layer having a lower p-impurity concentration (p⁻-layer or non-doped layer 11) is disposed in the p-pillar layer 3 to form the impurity-amount-larger portion 3H, it can also provide the same effect as described above. Further, the position at which avalanche breakdown occurs is always at the impurity-amount-larger portion 3H, whereby a high avalanche withstanding capability can be obtained with high reproducibility. The structure shown in FIG. 6 can be formed by a process that includes preparing a substrate with an n⁻-layer and an n-layer stacked one on the other, forming trench grooves in the surface of the n-layer, and filling the grooves with a p-semiconductor while controlling the doping amount to be lower or zero from halfway.

Fourth Embodiment

Figure 7A:
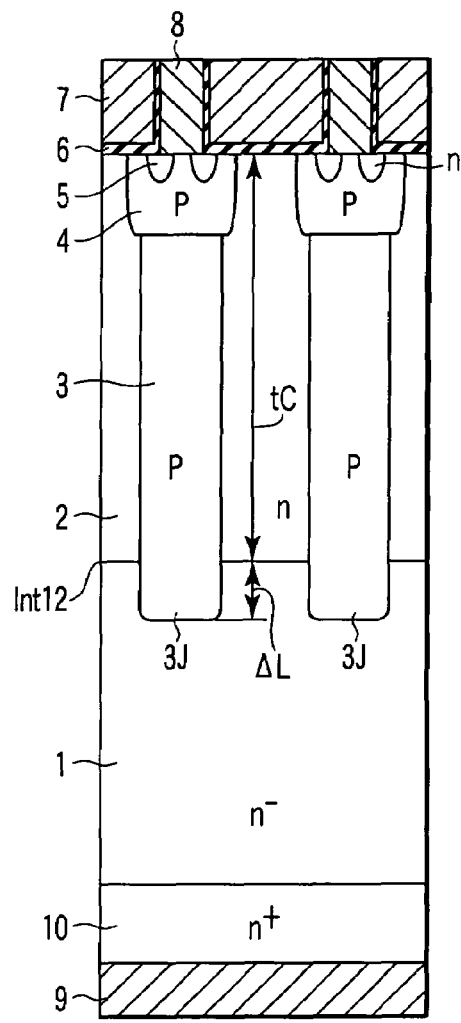
FIG. 7A is a sectional perspective view schematically showing a power semiconductor device (power MOS FET) according to a fourth embodiment of the present invention.
Figure 7B:
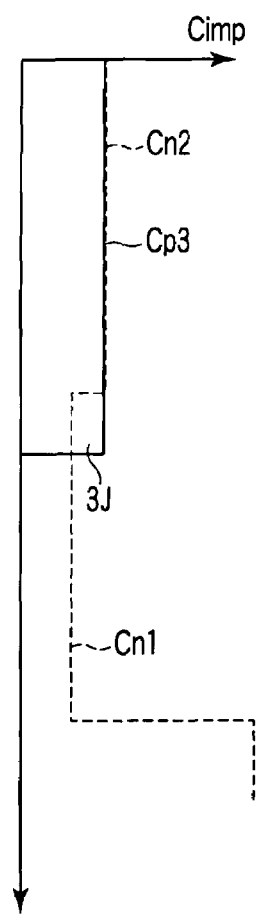
FIG. 7B is a view showing a profile of impurity concentration Cimp in the depth direction of the device shown in FIG. 7A.

FIG. 7A is a sectional perspective view schematically showing a power semiconductor device (power MOS FET) according to a fourth embodiment of the present invention. FIG. 7B is a view showing a profile of impurity concentration Cimp in the depth direction of the device shown in FIG. 7A. As shown in FIG. 7A, this device includes p-pillar layers 3 each of which is provided with an extension bottom 3J that extends into the n⁻-drift layer 1 beyond the interface position Int12 between the n-pillar layers 2 and the n⁻-drift layer. On the other hand, as shown in FIGS. 7A and 7B, each p-pillar layer 3 has an essentially constant width and an essentially uniform p-impurity concentration over the entirety in the depth direction. The n-impurity concentration Cn2 in the n-pillar layer 2, and the p-impurity concentration Cp3 in the p-pillar layer 3 are essentially the same in value.

Figure 7C:
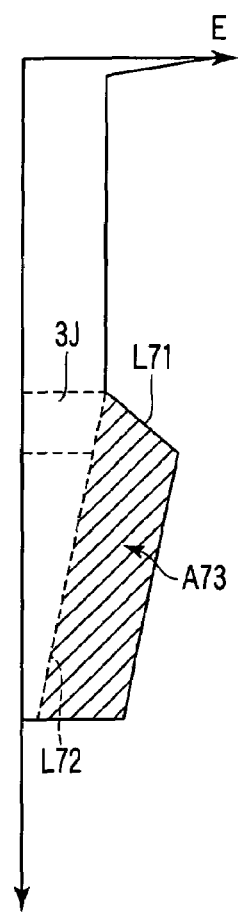
FIG. 7C is a view showing the distribution of electric field intensity E in the depth direction of the device shown in FIG. 7A.

FIG. 7C is a view showing the distribution of electric field intensity E in the depth direction of the device shown in FIG. 7A. In FIG. 7C, a solid line L71 denotes an electric field intensity distribution in a case where the extension bottom 3J is added to the bottom of the p-pillar layer 3. A broken line L72 denotes an electric field intensity distribution in a case where the extension bottom 3J is not added to the p-pillar layer. A hatched portion A73 denotes an increase in breakdown voltage due to the change in electric field intensity distribution.

As shown in FIG. 7C, in the device according to this embodiment, the electric field intensity becomes higher at the extension bottom 3J of the p-pillar layer 3 due to a large difference in impurity concentration between the extension bottom 3J and the n⁻-drift layer 1 around it. This increases the electric field intensity in the n⁻-drift layer 1, and thereby brings about an electric field intensity distribution shown by the solid line L71. As a consequence, the n⁻-drift layer 1 can hold a higher voltage and improve the breakdown voltage. Further, the breakdown voltage can be increased without any change in the impurity concentrations of the n-pillar layer 2 and n⁻-drift layer 1 on which the on-resistance depends, thereby improving the tradeoff between the breakdown voltage and on-resistance. Furthermore, the position at which avalanche breakdown occurs is always at the extension bottom 3J, where the electric field intensity is higher, and thus the avalanche withstanding capability fluctuates less. As a consequence, these characteristics can be obtained with high reproducibility for a plurality of devices.

The distance ΔL in the depth direction from the interface position Int12 to the lower end of the extension bottom 3J is set to be 0 to 0.35 times the thickness tC of the n-pillar layer 2, and preferably 0 to 0.1 times. Where the distance ΔL is larger than 0.35 times tC, the breakdown voltage is undesirably lowered.

Fifth Embodiment

Figure 8A:
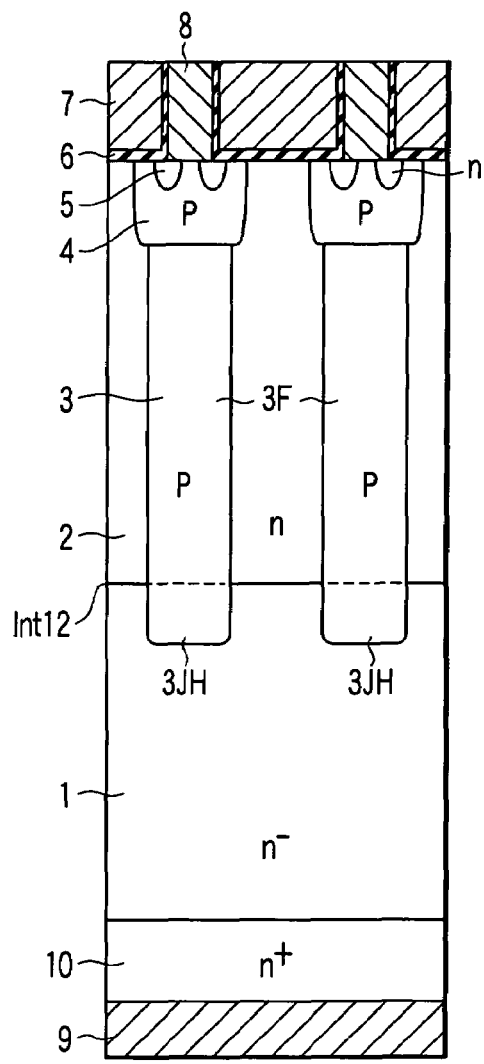
FIG. 8A is a sectional perspective view schematically showing a power semiconductor device (power MOS FET) according to a fifth embodiment of the present invention.
Figure 8B:
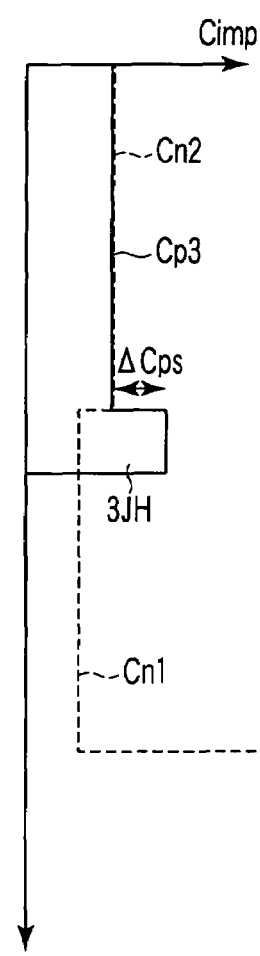
FIG. 8B is a view showing a profile of impurity concentration Cimp in the depth direction of the device shown in FIG. 8A.

FIG. 8A is a sectional perspective view schematically showing a power semiconductor device (power MOS FET) according to a fifth embodiment of the present invention. FIG. 8B is a view showing a profile of impurity concentration Cimp in the depth direction of the device shown in FIG. 8A. As shown in FIG. 8A, this device includes p-pillar layers 3 each of which is provided with an extension bottom 3JH that extends into the n⁻-drift layer 1 beyond the interface position Int12 between the n-pillar layers 2 and the n⁻-drift layer. Further, as shown in FIG. 8B, each p-pillar layer 3 is arranged such that the p-impurity concentration in the extension bottom 3JH is higher by ΔCps than the p-impurity concentration CP3 in the fundamental portion 3F. On the other hand, as shown in FIG. 8A, each p-pillar layer 3 has an essentially constant width over the entirety in the depth direction. In other words, this embodiment provides a structure obtained by a combination of the first and fourth embodiments.

Figure 8C:
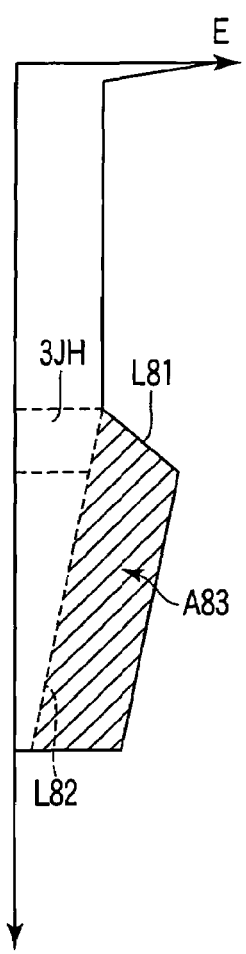
FIG. 8C is a view showing the distribution of electric field intensity E in the depth direction of the device shown in FIG. 8A.

FIG. 8C is a view showing the distribution of electric field intensity E in the depth direction of the device shown in FIG. 8A. In FIG. 8C, a solid line L81 denotes an electric field intensity distribution in a case where the extension bottom 3JH with a high impurity concentration is added to the bottom of the p-pillar layer 3. A broken line L82 denotes an electric field intensity distribution in a case where the extension bottom 3JH is not added to the p-pillar layer. A hatched portion A83 denotes an increase in breakdown voltage due to the change in electric field intensity distribution.

As shown in FIG. 8C, also in the device according to this embodiment, the electric field intensity becomes higher at the extension bottom 3JH of the p-pillar layer 3 due to a large difference in impurity concentration between the extension bottom 3JH and the n⁻-drift layer 1 around it. This increases the electric field intensity in the n⁻-drift layer 1, and thereby brings about an electric field intensity distribution shown by the solid line L81. In this embodiment, since the extension bottom 3JH is surrounded by the n⁻-layer 1, the impurity concentration increase ΔCps can be smaller than the impurity concentration increase ΔCpx1 shown in FIG. 1B, for the same effect.

Sixth Embodiment

Figure 9A:
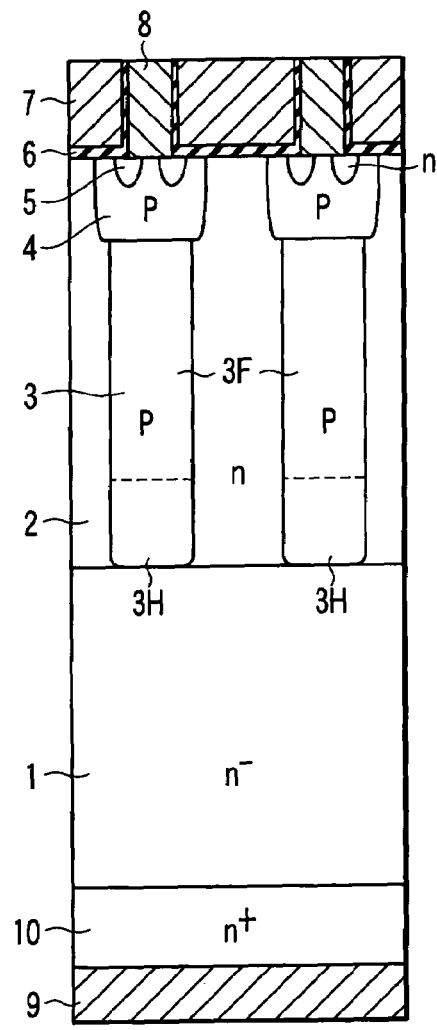
FIG. 9A is a sectional perspective view schematically showing a power semiconductor device (power MOS FET) according to a sixth embodiment of the present invention.
Figure 9B:
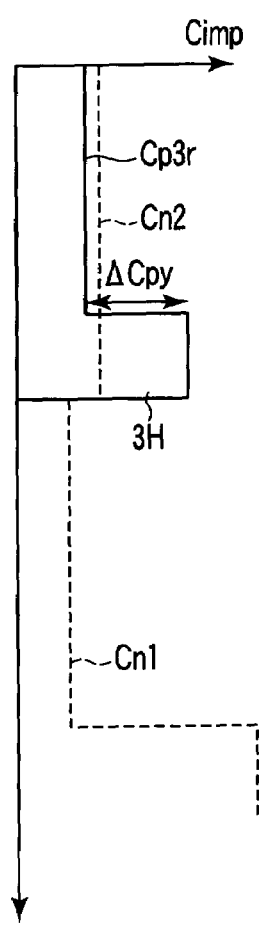
FIG. 9B is a view showing a profile of impurity concentration Cimp in the depth direction of the device shown in FIG. 9A.

FIG. 9A is a sectional perspective view schematically showing a power semiconductor device (power MOS FET) according to a sixth embodiment of the present invention. FIG. 9B is a view showing a profile of impurity concentration Cimp in the depth direction of the device shown in FIG. 9A. In FIG. 9B, Cn1, Cn2, and Cp3r denote the n-impurity concentration in the n⁻-drift layer 1, the n-impurity concentration in each n-pillar layer 2, and the p-impurity concentration in the fundamental portion 3F of each p-pillar layer 3, respectively. Unlike the first to fifth embodiments, the concentration Cp3r in the fundamental portion 3F of each p-pillar layer 3 is lower than the concentration Cn2 in the n-pillar layer 2.

As shown in FIG. 9B, each p-pillar layer 3 is arranged such that the p-impurity concentration in the bottom is higher by ΔCpy (Cn2<Cp3r+ΔCpy) than the p-impurity concentration CP3 in the fundamental portion 3F. On the other hand, as shown in FIG. 9A, each p-pillar layer 3 has an essentially constant width over the entirety in the depth direction. As a consequence, the p-pillar layer 3 is set to have a predetermined portion (impurity-amount-larger portion) 3H at the bottom, so that the impurity amount in the layer 3 locally increases in the depth direction.

In general, the highest breakdown voltage of a superjunction structure is obtained where the impurity total amounts of the p-pillar layer and n-pillar layer are equal to each other. In the concentration profile shown in FIG. 1B, however, the p-impurity total amount in the p-pillar layer 3 is larger than the n-impurity total amount in the n-pillar layer 2 by the amount corresponding to the concentration increase in the bottom. In this case, the breakdown voltage may decrease due to the increase in the impurity concentration in the p-pillar layer, and thus the process margin becomes smaller in terms of the impurity total amount.

On the other hand, in the concentration profile shown in FIG. 9B, the concentration Cp3r in the fundamental portion 3F of the p-pillar layer 3 is set to be lower than the concentration Cn2 of the n-pillar layers 2, so that the impurity total amount in the p-pillar layer 3 is the same as the impurity total amount in the n-pillar layer 2. Specifically, the concentration Cp3r is set to be 0.9 to 1.0 times the concentration Cn2, and preferably 0.95 to 1.0 times. If the ratio Cp3r/Cn2 is smaller than 0.9, the breakdown voltage becomes too low.

Figure 9C:
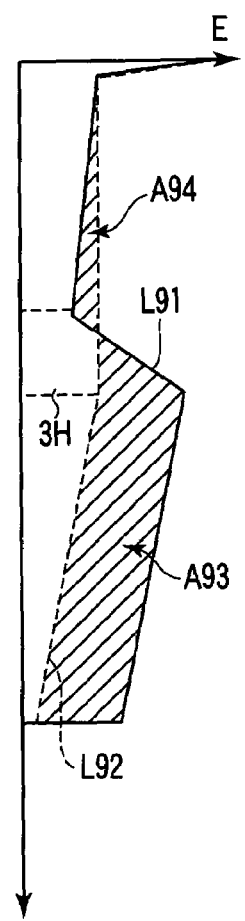
FIG. 9C is a view showing the distribution of electric field intensity E in the depth direction of the device shown in FIG. 9A.

FIG. 9C is a view showing the distribution of electric field intensity E in the depth direction of the device shown in FIG. 9A. In FIG. 9C, a solid line L91 denotes an electric field intensity distribution in a case where the impurity-amount-larger portion 3H is formed at the bottom of the p-pillar layer 3, and the impurity concentration in the fundamental portion 3F of the p-pillar layer 3 is set to be lower. A broken line L92 denotes an electric field intensity distribution in a case where the impurity concentration in the p-pillar layer 3 is not reduced but set to be uniform. Hatched portions A93 and A94 denote a breakdown voltage increase and a breakdown voltage decrease, respectively, due to the change in electric field intensity distribution.

As shown in FIG. 9C, in the device according to this embodiment, the hold voltage at the superjunction structure is slightly lowered, thereby bring about the breakdown voltage decrease A94, but this is fully compensated for by the breakdown voltage increase A93 at the n⁻-drift layer 1. Further, since the impurity total amount in the p-pillar layer 3 is set to be the same as the impurity total amount in the n-pillar layer 2, the breakdown voltage is less affected by change in the impurity concentration in the p-pillar layer, so the process margin becomes larger.

Seventh Embodiment

Figure 10A:
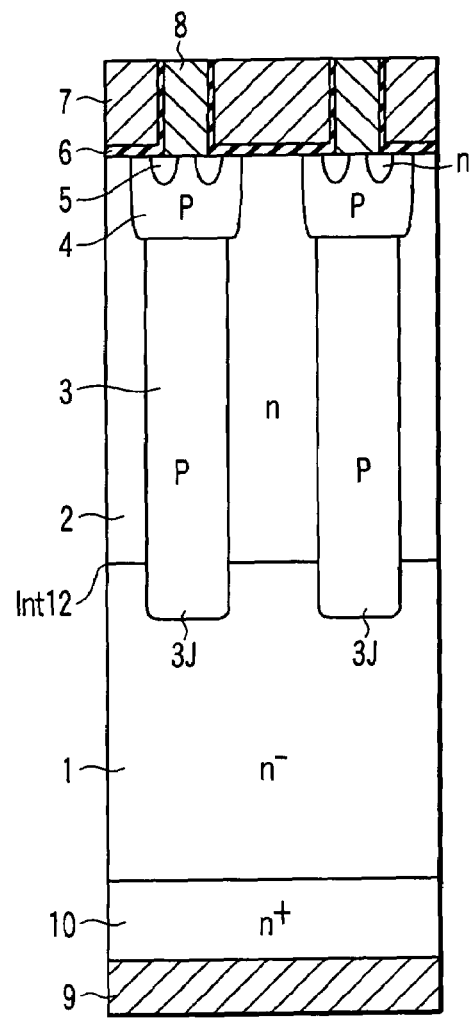
FIG. 10A is a sectional perspective view schematically showing a power semiconductor device (power MOS FET) according to a seventh embodiment of the present invention.
Figure 10B:
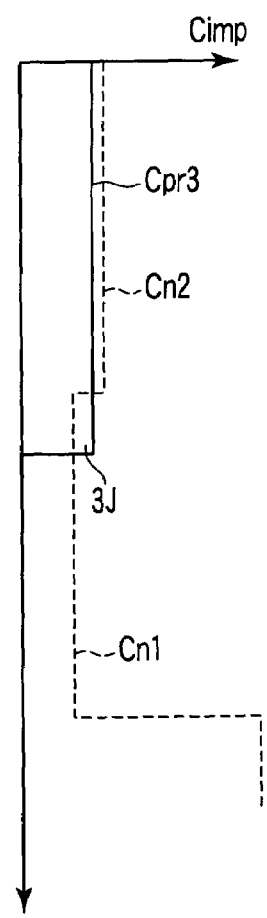
FIG. 10B is a view showing a profile of impurity concentration Cimp in the depth direction of the device shown in FIG. 10A.

FIG. 10A is a sectional perspective view schematically showing a power semiconductor device (power MOS FET) according to a seventh embodiment of the present invention. FIG. 10B is a view showing a profile of impurity concentration Cimp in the depth direction of the device shown in FIG. 10A. As shown in FIGS. 10A and 10B, the seventh embodiment provides a structure obtained by a combination of the fourth and sixth embodiments.

Figure 10C:
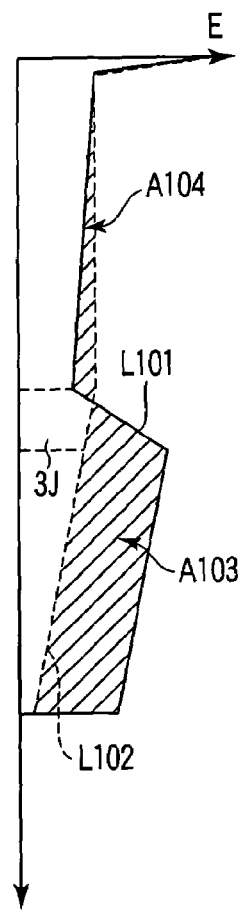
FIG. 10C is a view showing the distribution of electric field intensity E in the depth direction of the device shown in FIG. 10A.

FIG. 10C is a view showing the distribution of electric field intensity E in the depth direction of the device shown in FIG. 10A. In FIG. 10C, a solid line L101 denotes an electric field intensity distribution in a case where the extension bottom 3J is added to the bottom of the p-pillar layer 3, and the impurity concentration in the p-pillar layer 3 is set to be lower. A broken line L102 denotes an electric field intensity distribution in a case where the extension bottom 3J is not added to the p-pillar layer, and the impurity concentration in the p-pillar layer 3 is not reduced. Hatched portions A103 and A104 denote a breakdown voltage increase and a breakdown voltage decrease, respectively, due to the change in electric field intensity distribution.

According to the seventh embodiment, it is possible to obtain a combination of the effects of the fourth and sixth embodiments.

Eighth Embodiment

Figure 11A:
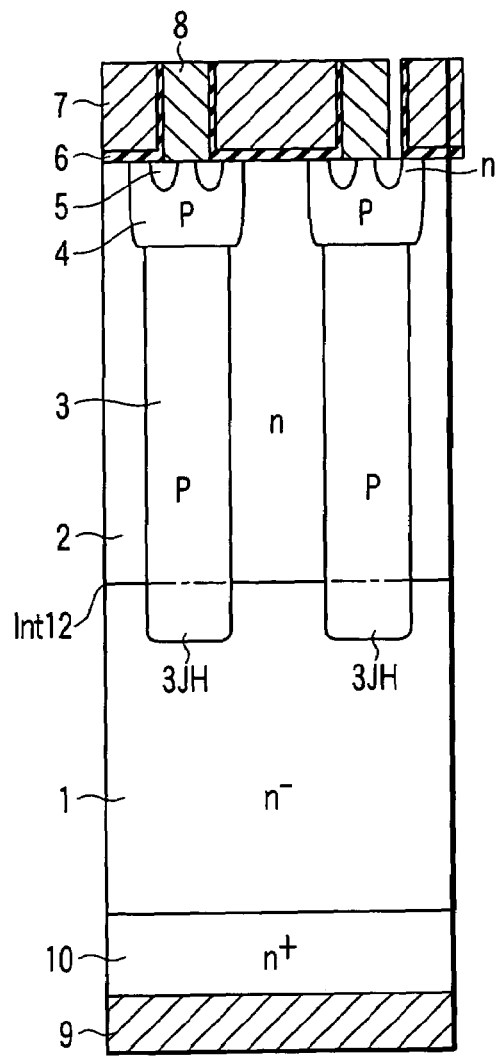
FIG. 11A is a sectional perspective view schematically showing a power semiconductor device (power MOS FET) according to an eighth embodiment of the present invention.
Figure 11B:
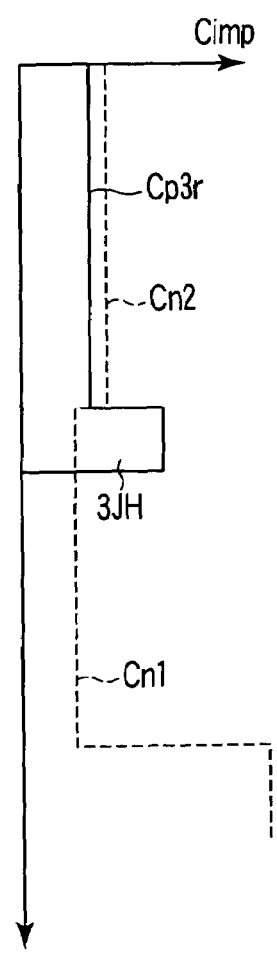
FIG. 11B is a view showing a profile of impurity concentration Cimp in the depth direction of the device shown in FIG. 11A.

FIG. 11A is a sectional perspective view schematically showing a power semiconductor device (power MOS FET) according to an eighth embodiment of the present invention. FIG. 11B is a view showing a profile of impurity concentration Cimp in the depth direction of the device shown in FIG. 11A. As shown in FIGS. 11A and 11B, the eighth embodiment provides a structure obtained by a combination of the fifth and sixth embodiments.

Figure 11C:
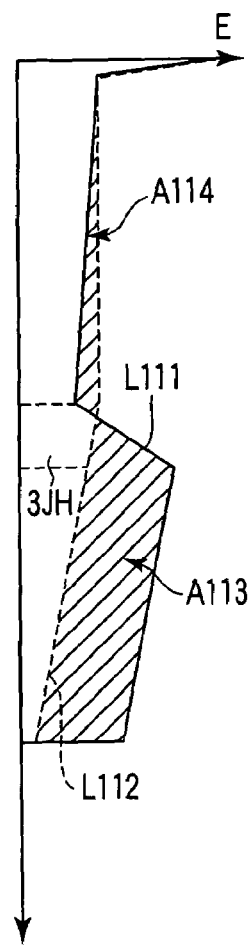
FIG. 11C is a view showing the distribution of electric field intensity E in the depth direction of the device shown in FIG. 11A.

FIG. 11C is a view showing the distribution of electric field intensity E in the depth direction of the device shown in FIG. 11A. In FIG. 11C, a solid line L111 denotes an electric field intensity distribution in a case where the extension bottom 3JH with a high impurity concentration is added to the bottom of the p-pillar layer 3, and the impurity concentration in the fundamental portion 3F of the p-pillar layer 3 is set to be lower. A broken line L112 denotes an electric field intensity distribution in a case where the extension bottom 3JH is not added to the p-pillar layer, and the impurity concentration in the p-pillar layer 3 is not reduced. Hatched portions A113 and A114 denote a breakdown voltage increase and a breakdown voltage decrease, respectively, due to the change in electric field intensity distribution.

According to the eighth embodiment, it is possible to obtain a combination of the effects of the fifth and sixth embodiments.

<Common Matters of the First to Eighth Embodiments>

According to the first to eighth embodiment, there is provided a power semiconductor device including a superjunction structure, in which the breakdown voltage can be improved without complicating the manufacturing process thereof.

In the first to eighth embodiments, various methods can be used to form a superjunction structure. For example, as explained in the embodiments, it is possible to adopt a multi-epitaxial method which repeats ion implantation and buried crystal epitaxial growth, or a method which comprises trench formation and buried crystal growth in trenches. Another applicable method is to perform ion implantation through trench sidewalls in a diagonal direction. The semiconductor material of a device is not limited to silicon (Si), and it may be another material, such as a compound semiconductor, e.g., silicon carbide (SiC), gallium nitride (GaN), or a wide-bandgap semiconductor, e.g., diamond.

In the first to eighth embodiments, the first conductivity type is n-type, and the second conductivity type is p-type. Alternatively, the embodiments described above may be applied to a case where the first conductivity type is p-type, and the second conductivity type is n-type. The plan view pattern of units of the MOS gate or superjunction structure is not limited to a stripe pattern, and it may be a grid pattern or a staggered pattern. The MOS gate structure has been exemplified by a planar structure, but it may be a trench structure. The device according to each embodiment can be implemented with any termination region structure, such as a field plate structure, a RESURF structure, or a guard ring structure, although no specific termination region structure is shown.

The first to eighth embodiments take, as an example, a vertical MOS FET having a superjunction structure. Alternatively, the embodiments described above may be similarly applied to another power semiconductor device having a superjunction structure and a MOS or MIS (Metal-Insulator-Semiconductor) gate, such as an SBD (Schottky Barrier Diode), a hybrid device of a MOS FET and SBD, an SIT (Static Induction Transistor), or an IGBT (Insulated Gate Bipolar Transistor).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power semiconductor device comprising:
   a first semiconductor layer of a first conductivity type having first and second surfaces respectively on upper and lower sides in a depth direction;
   a plurality of second semiconductor layers of the first conductivity type disposed on the first surface of the first semiconductor layer, at intervals in a lateral direction perpendicular to the depth direction;
   a plurality of third semiconductor layers of a second conductivity type respectively disposed between the second semiconductor layers;
   a plurality of fourth semiconductor layers of the second conductivity type respectively disposed in contact with upper portions of the third semiconductor layers between the second semiconductor layers;
   a plurality of fifth semiconductor layers of the first conductivity type respectively formed in surfaces of the fourth semiconductor layers;

a first main electrode electrically connected to the second surface of the first semiconductor layer;

a second main electrode electrically connected to each set of the fourth semiconductor layers and the fifth semiconductor layers; and a gate electrode facing, through a first insulating film, a channel region, which is each of portions of the fourth semiconductor layers interposed between the fifth semiconductor layers and the second semiconductor layers, wherein the first semiconductor layer is lower in impurity concentration of the first conductivity type than each second semiconductor layer, and each third semiconductor layer includes a fundamental portion and an impurity-amount-larger portion, such that the impurity-amount-larger portion is formed locally in the depth direction and is higher in impurity amount than the fundamental portion, where the impurity amount is defined by a total amount of impurities of the second conductivity type over a cross section in the lateral direction.

2. The device according to claim 1, wherein the impurity-amount-larger portion is disposed below a center of each third semiconductor layer in the depth direction.

3. The device according to claim 2, wherein the impurity-amount-larger portion is disposed substantially at a bottom of each third semiconductor layer.

4. The device according to claim 1, wherein the impurityamount-larger portion has a value of the impurity amount 1 to 1.35 times that of the fundamental portion.

5. The device according to claim 1, wherein a factor to form the impurity-amount-larger portion includes a change in an impurity concentration profile of each third semiconductor layer in the depth direction.

6. The device according to claim 1, wherein a factor to form the impurityamount-larger portion includes a change in an effective width profile of each third semiconductor layer in the depth direction.

7. The device according to claim 1, wherein each third semiconductor layer is provided with a layer disposed therein, which is lower in impurity concentration of the second conductivity type than the fundamental portion, and extends in the depth direction to correspond to the fundamental portion.

8. The device according to claim 1, wherein a ratio (tA/tB) of a thickness tA of the first semiconductor layer relative to a total thickness tB of each second semiconductor layer and the first semiconductor layer is set to be 0 to 0.41 in the depth direction.

9. The device according to claim 1, wherein an impurity concentration of the second conductivity type in the fundamental portion is lower than an impurity concentration of the first conductivity type in each second semiconductor layer.

10. The device according to claim 9, wherein the impurity concentration of the second conductivity type in the fundamental portion is set to be 0.9 to 1.0 times the impurity concentration of the first conductivity type in each second semiconductor layer.

11. The device according to claim 1, wherein each third semiconductor layer includes an extension bottom, which extends into the first semiconductor layer beyond an interface position between the first semiconductor layer and each second semiconductor layer.

12. The device according to claim 11, wherein a distance in the depth direction from the interface position to a lower end of the extension bottom of each third semiconductor layer is set to be 0 to 0.35 times a thickness of each second semiconductor layer in the depth direction.

13. The device according to claim 1, wherein an impurity concentration of the first conductivity type in the first semiconductor layer is set to be $8 \times 10^{13}$ to $2.5 \times 10^{16}$ cm$^{-3}$, an impurity concentration of the first conductivity type in each second semiconductor layer is set to be $1 \times 10^{15}$ to $3 \times 10^{16}$ cm$^{-3}$, and an impurity concentration of the second conductivity type in each third semiconductor layer is set to be $1 \times 10^{15}$ to $4 \times 10^{16}$ cm$^{-3}$.

14. A power semiconductor device comprising:

a first semiconductor layer of a first conductivity type having first and second surfaces respectively on upper and lower sides in a depth direction;

a plurality of second semiconductor layers of the first conductivity type disposed on the first surface of the first semiconductor layer, at intervals in a lateral direction perpendicular to the depth direction;

a plurality of third semiconductor layers of a second conductivity type respectively disposed between the second semiconductor layers;

a plurality of fourth semiconductor layers of the second conductivity type respectively disposed in contact with upper portions of the third semiconductor layers between the second semiconductor layers;

a plurality of fifth semiconductor layers of the first conductivity type respectively formed in surfaces of the fourth semiconductor layers;

a first main electrode electrically connected to the second surface of the first semiconductor layer;

a second main electrode electrically connected to each set of the fourth semiconductor layers and the fifth semiconductor layers; and a gate electrode facing, through a first insulating film, a channel region, which is each of portions of the fourth semiconductor layers interposed between the fifth semiconductor layers and the second semiconductor layers, wherein the first semiconductor layer is lower in impurity concentration of the first conductivity type than each second semiconductor layer, and each third semiconductor layer includes an extension bottom, which extends into the first semiconductor layer beyond an interface position between the first semiconductor layer and each second semiconductor layer.

15. The device according to claim 14, wherein a distance in the depth direction from the interface position to a lower end of the extension bottom of each third semiconductor layer is set to be 0 to 0.35 times a thickness of each second semiconductor layer in the depth direction.

16. The device according to claim 14, wherein a ratio (tA/tB) of a thickness tA of the first semiconductor layer relative to a total thickness tB of each second semiconductor layer and the first semiconductor layer is set to be 0 to 0.41 in the depth direction.

17. The device according to claim 14, wherein each third semiconductor layer has an essentially uniform impurity amount in the depth direction, where the impurity amount is defined by a total amount of impurities of the second conductivity type over a cross section in the lateral direction.

18. The device according to claim 14, wherein an impurity concentration of the second conductivity type in each third semiconductor layer is lower than an impurity concentration of the first conductivity type in each second semiconductor layer.

19. The device according to claim 18, wherein the impurity concentration of the second conductivity type in each third semiconductor layer is set to be 0.9 to 1.0 times the impurity concentration of the first conductivity type in each second semiconductor layer.

20. The device according to claim 14, wherein an impurity concentration of the first conductivity type in the first semiconductor layer is set to be $8\times10^{13}$ to $2.5\times10^{16}$ cm$^{-3}$, an impurity concentration of the first conductivity type in each second semiconductor layer is set to be $1\times10^{15}$ to $3\times10^{16}$ cm$^{-3}$, and an impurity concentration of the second conductivity type in each third semiconductor layer is set to be $1\times10^{15}$ to $4\times10^{16}$ cm$^{-3}$.

* * * * *